United States Patent

Tiemeijer et al.

(10) Patent No.: US 9,570,270 B2
(45) Date of Patent: Feb. 14, 2017

(54) METHOD OF USING AN ENVIRONMENTAL TRANSMISSION ELECTRON MICROSCOPE

(71) Applicant: FEI Company, Hillsboro, OR (US)

(72) Inventors: Peter Christiaan Tiemeijer, Eindhoven (NL); Stan Johan Pieter Konings, Breda (NL); Alexander Henstra, Utrecht (NL)

(73) Assignee: FEI COMPANY, Hillsboro, OR (US)

( * ) Notice: Subject to any disclaimer, the term of this patent is extended or adjusted under 35 U.S.C. 154(b) by 350 days.

(21) Appl. No.: 14/455,802

(22) Filed: Aug. 8, 2014

(65) Prior Publication Data

US 2015/0041647 A1 Feb. 12, 2015

(30) Foreign Application Priority Data

Aug. 12, 2013 (EP) .................................. 13180022

(51) Int. Cl.
*H01J 37/26* (2006.01)
*H01J 37/147* (2006.01)
*H01J 37/22* (2006.01)

(52) U.S. Cl.
CPC ............ *H01J 37/261* (2013.01); *H01J 37/147* (2013.01); *H01J 37/22* (2013.01); *H01J 37/26* (2013.01); *H01J 37/263* (2013.01); *H01J 2237/006* (2013.01); *H01J 2237/262* (2013.01); *H01J 2237/2605* (2013.01)

(58) Field of Classification Search
USPC .............................. 250/311, 306, 307, 396 R
See application file for complete search history.

(56) References Cited

U.S. PATENT DOCUMENTS

| 6,184,525 B1 | 2/2001 | Van Der Mast |
| 6,365,896 B1 | 4/2002 | Van Der Mast |
| 2010/0108881 A1* | 5/2010 | Toth ...................... H01J 37/244 250/307 |
| 2011/0079710 A1 | 4/2011 | Damiano, Jr. et al. |

(Continued)

FOREIGN PATENT DOCUMENTS

| DE | 112010005188 | 10/2012 |
| JP | 2011034895 | 2/2011 |

OTHER PUBLICATIONS

Wagner, J.B., et al., "Exploring the Environmental Transmission Electron Microscope", Micron, 2012, pp. 1169-1175, vol. 43.

(Continued)

*Primary Examiner* — Kiet T Nguyen
(74) *Attorney, Agent, or Firm* — Scheinberg & Associates, P.C.; Michael O. Scheinberg; John E. Hillert

(57) ABSTRACT

An environmental transmission electron microscope (ETEM) suffers from gas-induced resolution deterioration. Inventors conclude that the deterioration is due to ionization of gas in the sample chamber of the ETEM, and propose to use an electric field in the sample chamber to remove the ionized gas, thereby diminishing the gas-induced resolution deterioration. The electric field need not be a strong field, and can be caused by, for example, biasing the sample with respect to the sample chamber. A bias voltage of 100 V applied via voltage source is sufficient for a marked improvement the gas-induced resolution deterioration. Alternatively an electric field perpendicular to the optical axis can be used, for example by placing an electrically biased wire or gauze off-axis in the sample chamber.

21 Claims, 3 Drawing Sheets

(56) References Cited

U.S. PATENT DOCUMENTS

Figure 1:
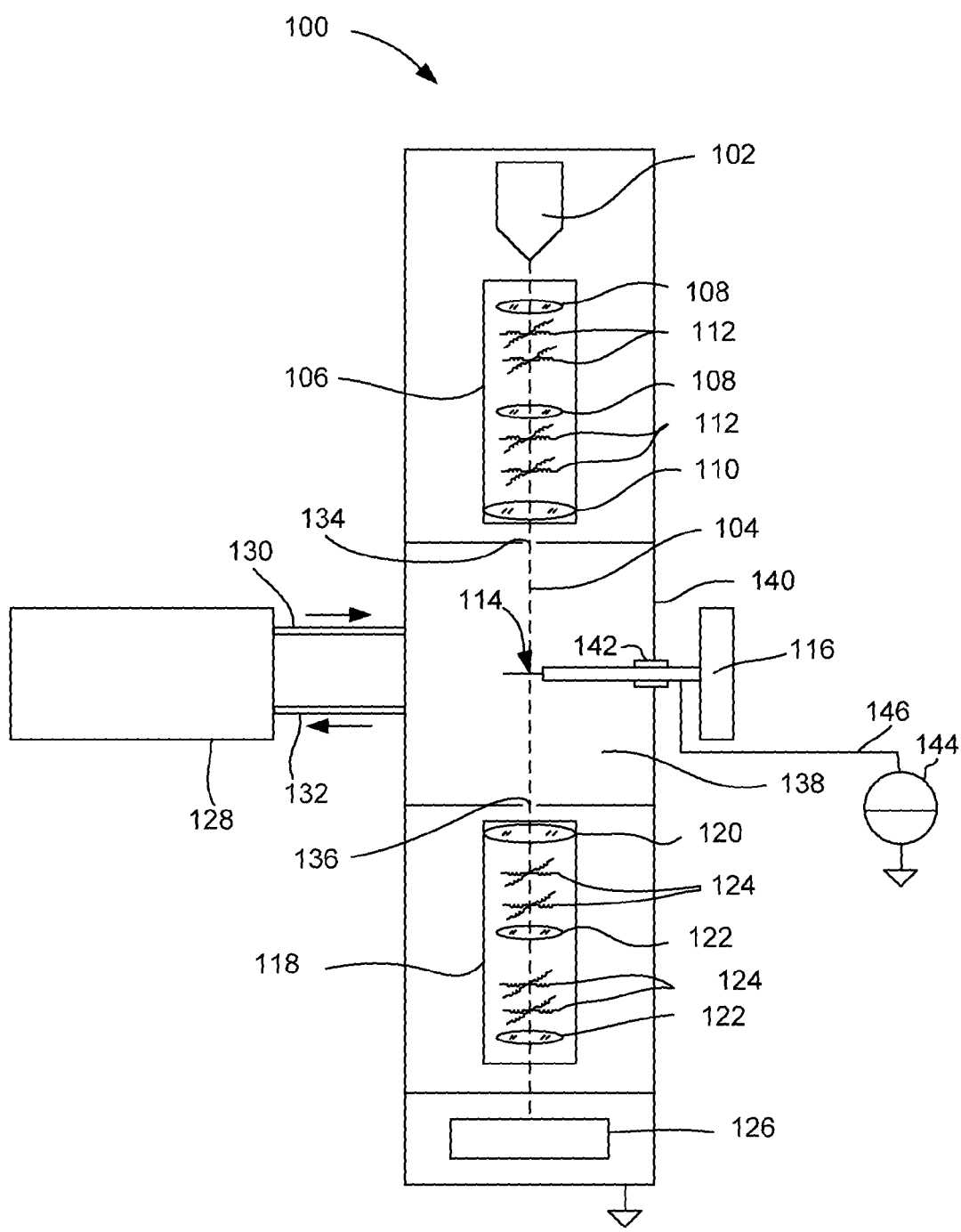

2012/0205539 A1    8/2012    Hlavenka et al.

OTHER PUBLICATIONS

Creemer, J.F. et al., "Atomic-scale electron microscopy at ambient pressure," Ultramicroscopy, 2008, pp. 993-998, vol. 108.
Giorgio, S. et al., "Environmental electron microscopy (ETEM) for catalysts with a closed E-cell with carbon windows," Ultramicroscopy, 2006, pp. 503-507, vol. 106.

* cited by examiner

METHOD OF USING AN ENVIRONMENTAL TRANSMISSION ELECTRON MICROSCOPE

This Application claims priority from European Provisional App. No. 13180022.9, filed Aug. 12, 2013, of which is hereby incorporated by reference.

The invention relates to a method of using an Environmental Transmission Electron Microscope, the Environmental Transmission Electron Microscope comprising:
- an electron source for generating a beam of electrons;
- a condenser system for directing the beam of electrons to a sample, the sample located in a sample chamber;
- an imaging system for imaging electrons transmitted through the sample on a detector system;
- a gas regulating system for regulating the gas pressure and gas composition in the sample chamber, the gas regulation system maintaining a pressure of between 0.5 and 50 mbar in at least part of the sample chamber, the ETEM suffering from gas-induced resolution deterioration.

Such an Environment Transmission Electron Microscopy (ETEM) is inter alia known from European Patent No. EP2555221. Such an ETEM resembles a Transmission Electron Microscope, but instead of a sample chamber with high vacuum (for example $10^{-4}$ mbar or less) a vacuum chamber with a pressure of for example between 0.1 to 50 mbar is used. This enables, for example, direct observation of chemical processes in catalysts.

Such an ETEM is commercially available from, for example, FEI Company, Hillsboro, USA under the name Titan ETEM G2.

It is noted that an ETEM may be equipped with scanning means, enabling it to operate as a Environmental Scanning Transmission Electron Microscope.

It is further noted that an ETEM is not a TEM equipped with a so-called environmental cell, that is, a TEM equipped with an enclosed volume in which the sample is placed, the enclosed volume at a pressure higher than the pressure of the sample chamber and placed in the sample chamber of the TEM.

A problem that occurs in an ETEM, especially when using high beam currents, is that the resolution deteriorates, especially when using a high beam current and a high gas pressure.

This so-called gas-induced resolution deterioration is described in "On the gas-dependent image resolution in an aberration-corrected ETEM", J. R. Jinschek, Microscopy and Microanalysis, vol. 18, issue S2, pp. 1148-1149.

There is a need for an ETEM with reduced gas-induced resolution deterioration.

It is an object of the invention to provide a solution to reduce the gas-induced resolution deterioration.

To that end the invention is characterized in that the Environmental Transmission Electron Microscope comprises means generating an electric field in the sample chamber removing said ionized gas, as a result of which gas-induced resolution deterioration is diminished.

The invention is based on the insight that the gas-induced resolution deterioration results from scattering of the electrons on the ionized gas. This ionized gas is formed by collisions of electrons with neutral gas, but once ionized the gas forms scatter sites for the electron beam until the ionized gas atoms and -molecules are sufficiently far removed from the beam. Inventors realized that an electric field in the sample chamber removes the ionized particles.

It is noted that, as the function of the electric field is only to remove ionized gas, it need not be a strong field and the effect on the beam, consisting of electrons with a selectable energy of typically between 80 keV and 300 keV, is minimal.

In an embodiment of the invention the electric field is parallel to the beam of electrons.

In this embodiment the ionized gas is removed by a field parallel to the beam. An advantage of this solution is that the field does not deflect the beam, only a slight defocus occurs.

As is known to the skilled person a sample holder is used to hold and position the sample in the sample chamber. The field can be caused by biasing the sample holder with respect to the walls of the sample chamber, the bias either being positive or negative. When the bias is positive, negatively charged gas drifts toward the sample, when the bias is negative, negatively charged gas drifts toward the wall of the sample chamber In another embodiment of the invention the electric field is perpendicular to the beam of electrons.

In this embodiment the sample holder need not be biased. Instead, one or more electrodes cause a field perpendicular to the beam. This can be a transverse field (a dipole field), but it may also be a higher order multipole field, or a field caused by a wire or a gauze that is placed off-centre in the sample chamber, or a field caused by, for example, one or more ring electrodes surrounding the beam.

In yet another embodiment the electric field is a field perpendicular to the beam and a magnetic field perpendicular to the beam and perpendicular to the electric field counters the effect of the electric field on the beam.

By adding a magnetic field perpendicular to both the beam and the electric field a Wien filter is formed for the beam and the trajectory of the beam is a straight path. It is noted that a Wien filter shows energy dispersion and no deflection, but at another excitation it is possible to operate the filter such that deflection occurs, but without energy dispersion.

In another embodiment the sample chamber is embedded in an evacuated chamber of the ETEM.

This embodiment describes the use of an ETEM, in which the ETEM is formed by a standard TEM (Transmission Electron Microscope) or a STEM (Scanning Transmission Electron Microscope) cooperating with an environmental cell positioned within the sample chamber of the TEM, the environmental cell enclosing the high pressure area. Such environmental cells are known from, for example, "A MEMS reactor for atomic-scale microscopy of nanomaterials under industrial relevant conditions", J. F. Creemer et al., Journal of Microelectromechanical Systems, Vol. 19, NO. 2, April 2010.

It is noted that Transmission Electron Microscopes are known in which an electric field is generated in the sample chamber by detectors. Such a detector necessarily includes electronics for signal processing (amplification, etc.) and is used in scanning mode only, as then the position of the beam determines the positional information.

Therefore, in an aspect of the invention an Environmental Transmission Electron Microscopes, the Environmental Transmission Electron Microscope comprising:
- an electron source for generating a beam of electrons;
- a condenser system for directing the beam of electrons on a sample, the sample located in a sample chamber;
- an imaging system for imaging electrons transmitted through the sample on a detector system;
- a gas regulating system for regulating the gas pressure and gas composition in the sample chamber, the gas regulation system capable of maintaining a pressure of between 0.5 and 50 mbar in at least part of the sample chamber, the Environmental Transmission Electron Microscope in working suffering from gas-induced resolution deterioration, is characterized in that
the Environmental Transmission Electron Microscope is provided with means for generating an electric field in the sample chamber, said electric field removing ionized gas, the means not being part of or comprising a detector.

The electric field is here thus used to remove the ionized gas, not to (help) detect a signal.

Figure 2:
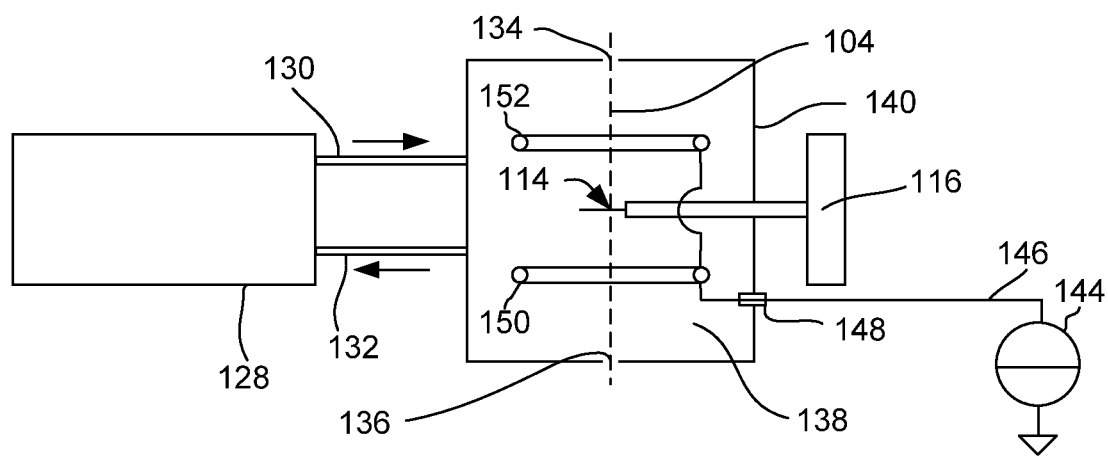
Figure 3:
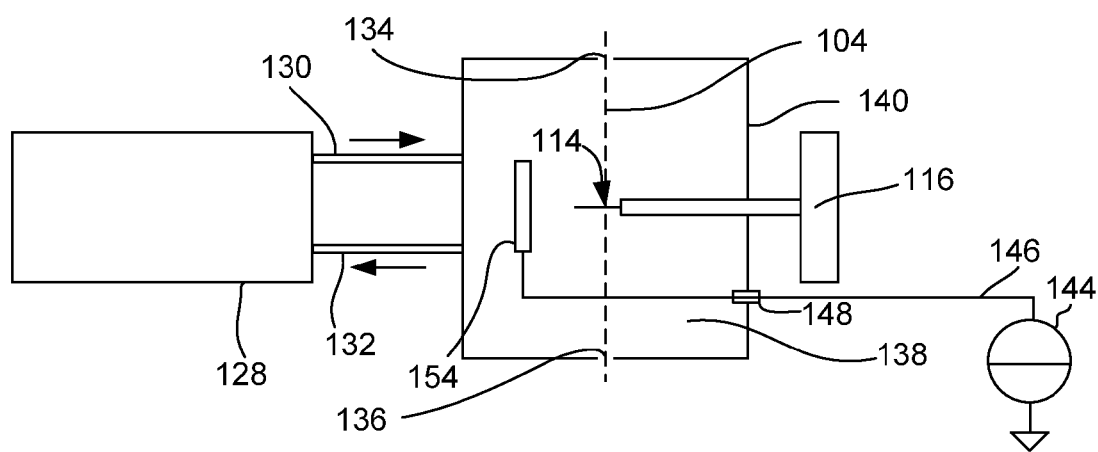

The invention is now elucidated using figures, in which identical numerals refer to corresponding features. To that end:

FIG. 1 schematically shows an ETEM with a biased sample holder,

FIG. 2 schematically shows the sample chamber of an ETEM with ring electrodes,

FIG. 3 schematically shows the sample chamber of an ETEM with a deflector.

FIG. 1 schematically shows an ETEM with a biased sample holder.

The ETEM 100 comprises an electron source 102 for producing a beam of electrons along optical axis 104, the electrons having a selectable energy of, for example, between 60 and 300 keV, although lower and higher energies are known to be used.

The beam of electrons is manipulated (focused, positioned) by the condenser system 106, the condenser system comprising lenses 108, deflectors 112, and the illuminating part 110 of the objective lens.

It is noted that the condenser system may comprise a corrector to minimize aberrations of the condenser system, more specifically the illuminating part of the objective lens.

The beam of electrons focused and aligned by the condenser system enters the sample chamber 138 and impinges on a sample 114, held and positioned by sample holder 116. Sample holder 116 typically positions the sample with respect to the beam in three directions, and often is capable to rotate the sample along one or more axis. The sample holder is here fed into the sample chamber via insulator 142, enabling biasing of the sample holder with respect to the rest of the ETEM, more specifically the wall 140 of the sample chamber. Voltage source 144 is connected to the sample holder via electric lead 146 for biasing the sample holder.

The electrons passing through the sample enter the imaging system 118 and form a strongly magnified image on detector 126. The imaging system comprises the imaging part 120 of the objective lens, magnifying lenses 122 and deflectors 124 for aligning the electrons to the optical axis of each lens.

It is noted that the imaging system may comprise a corrector to minimize aberrations of the imaging system, more specifically the imaging part 120 of the objective lens.

After leaving the imaging system the electrons impinge on detector 126. This detector system may for example be a pixilated detector (a CMOS camera, a fluorescent screen with fiber optics connecting the screen to a CCD camera), a fluorescent screen to be observed by the human eye or a camera via a window, or an Electron Energy Loss Spectrometer.

The sample chamber 138 is formed by a vacuum wall 140, and apertures 134 and 136 close to the optical axis 104 for passing the beam from the condenser system 106 to the sample chamber and from the sample chamber to the imaging system 118. A gas regulation system 128 is connected to the sample chamber via inlet channel 130 and return channel 132. The apertures act as pressure limiting apertures, as the pressure within the sample chamber 134 is much higher (0.1-50 mbar) than the pressure in the condenser system and the imaging system (typically $10^{-6}$ mbar is less).

The beam of electrons, when travelling through the sample chamber, ionizes gas. The ionized gas will slowly drift, until it reaches an electrically conductive part such as the wall 140 of the sample chamber. During the time such an ionized gas atom or molecule is in or close to the beam, it deflects electrons. This causes gas-induced resolution deterioration. Inventors found that the resolution deterioration depended on the pressure and composition of the gas and on the beam current. At a beam current of 10 nA and a pressure of 8 mbar of argon a resolution loss from 0.12 nm to 0.2 nm was measured. An unexpected aspect of this resolution loss is that it did not much depend on the beam current per area at the sample, but only on the total beam current.

The interpretation of this effect is that the electron beam ionizes the gas, and that the ionized gas randomly cause scattering of the electrons (both those between the condenser system and the sample and those between sample and the imaging system), thus blurring the image.

Inventors found that, by applying a bias of, for example, 100 V to the sample holder, a marked improvement was reached (after refocusing). It is noted that it is irrelevant whether the sample holder was biased with a negative voltage, or a positive voltage.

As an example, at a pressure of 8 mbar of Ar (argon) and a beam current of 10 nA, the resolution without an electric field in the chamber was 0.2 nA, while a field caused by biasing the sample and sample holder to 100 V (irrespective of the polarity) with respect to the sample chamber caused an improvement to 0.12 nm.

Likewise, at a pressure of 10 mbar of $N_2$ and a beam current of 5.5 nA, the resolution without an electric field in the chamber was 0.23 nA, while a field caused by biasing the sample and sample holder to 100 V (irrespective of the polarity) caused an improvement to 0.2 nm.

FIG. 2 schematically shows the sample chamber of an ETEM with ring electrodes.

FIG. 2 is derived from the mid-section of FIG. 1. Differences are: the electrical insulator/feed-through 142 is deleted and instead the voltage from voltage source 144 is led via electric lead 146 and electrical feed-through 148 to two ring electrodes, 150 and 152. These ring electrodes cause a field on the axis. It is noted that the ring electrodes need not form a complete circle, and an asymmetry is favorable as a field completely symmetric round the axis 104 has no gradient at the axis.

FIG. 3 schematically shows the sample chamber of an ETEM with a deflector.

FIG. 3 is identical to FIG. 2, with the exception that the ring electrodes 150 and 152 are exchanged by deflector plate 154. This deflector will attract or repel ionized gas from the axis. It is noted that the electrode may be formed as a plate, gauze, or even one wire (parallel to the beam or perpendicular to the beam).

The invention claimed is:
1. A method of using an environmental transmission electron microscope, the environmental transmission electron microscope comprising:
an electron source for generating a beam of electrons;
a condenser system for directing the beam of electrons on a sample, the sample located in a sample chamber;
an imaging system for imaging electrons transmitted through the sample on a detector system; and
a gas regulating system for regulating a gas pressure and a gas composition in the sample chamber, the gas regulation system maintaining a pressure of between

0.5 and 50 mbar in at least part of the sample chamber, the environmental transmission electron microscope suffering from gas-induced resolution deterioration, the method comprising:

generating a beam of electrons directing the beam of electrons on the sample in the sample chamber;

forming an image using electrons imaging transmitted through the sample and onto the detector system; and removing ionized gas from the sample chamber by generating an electric field in the sample chamber, as a result of which gas-induced resolution deterioration is diminished.

2. The method of claim 1 in which the electric field is an electric field that is parallel to the beam of electrons.

3. The method of claim 1 in which the electric field is an electric field that is perpendicular to the beam of electrons.

4. The method of claim 3 in which a magnetic field perpendicular to the beam of electrons and perpendicular to the electric field counters an effect of the electric field on the beam of electrons.

5. The method of claim 1 in which the sample chamber is embedded in an evacuated chamber of the environmental transmission electron microscope.

6. The method of claim 1 further comprising holding the sample with a sample holder and in which generating an electric field such that a gas-induced resolution deterioration of the environmental transmission electron microscope is diminished comprises biasing the sample holder with respect to walls of the sample chamber.

7. An environmental transmission electron microscope comprising:

an electron source for generating a beam of electrons;

a condenser system for directing the beam of electrons on a sampled, the sample located in a sample chamber;

an imaging system for imaging electrons transmitted through the sample and detected on a detector system;

a gas regulating system for regulating a gas pressure and a gas composition in the sample chamber, the gas regulating system capable of maintaining the gas pressure between 0.5 mbar and 50 mbar in at least part of the sample chamber; and a means for generating an electric field in the sample chamber, wherein the means for generating the electric field in the sample chamber is configured to remove ionized gas from the sample chamber such that a gas-induced resolution deterioration of the environmental transmission electron microscope is reduced.

8. The environmental transmission electron microscope of claim 7 in which the means for generating an electric field in the sample chamber is not part of or does not comprise a detector.

9. The environmental transmission electron microscope of claim 7 in which the means for generating an electric field in the sample chamber is configured to generate an electric field that is parallel to the beam of electrons.

10. The environmental transmission electron microscope of claim 9 wherein the means for generating the electric field comprises a voltage source and a sample holder configured to hold the sample, and wherein the voltage source is configured to bias the sample holder with respect to walls of the sample chamber to generate the electric field that is parallel to the beam of electrons.

11. The environmental transmission electron microscope of claim 7 in which the means for generating an electric field in the sample chamber is configured to generate an electric field that is perpendicular to the beam of electrons.

12. The environmental transmission electron microscope of claim 11 further comprising a wire or gauze placed off-center in the sample chamber and configured to generate the electric field that is perpendicular to the beam of electrons.

13. The environmental transmission electron microscope of claim 11 further comprising a one or more ring electrodes arranged around an optical axis of the environmental transmission electron microscope and configured to generate the electric field that is perpendicular to the beam of electrons.

14. The environmental transmission electron microscope of claim 13 wherein the one or more ring electrodes do not form a complete circle around the optical axis.

15. The environmental transmission electron microscope of claim 11 in which the environmental transmission electron microscope is configured to generate a magnetic field perpendicular to the beam of electrons and perpendicular to the electric field such that an effect of the electric field on the beam of electrons is countered.

16. The environmental transmission electron microscope of claim 15 in which the magnetic field and the electric field form a Wien filter for the beam of electrons that maintains a trajectory of the beam of electrons along a straight path.

17. The environmental transmission electron microscope of claim 7 further comprising an evacuated chamber, and wherein the sample chamber is embedded in the evacuated chamber.

18. The environmental transmission electron microscope of claim 7 further comprising a scanning means configured such that the environmental transmission electron microscope can operate as an environmental scanning transmission electron microscope.

19. A method of using an environmental transmission electron microscope comprising an electron source, a sample chamber, a condenser system, an imaging system, a detector system, and a gas regulating system, the method comprising:

generating a beam of electrons from the electron source;

directing the beam of electrons on a sample located in the sample chamber by using the condenser system;

imaging, using the imaging system, electrons transmitted through the sample and detected by the detector system;

maintaining a pressure between 0.5 mbar and 50 mbar in at least part of the sample chamber by using the gas regulating system; and removing ionized gas from the sample chamber by generating an electric field such that a gas-induced resolution deterioration of the environmental transmission electron microscope is diminished.

20. The method of claim 19 in which the electric field is an electric field that is parallel to the beam of electrons.

21. The method of claim 19 in which the electric field is an electric field that is perpendicular to the beam of electrons.

* * * * *